United States Patent [19]

Deckman et al.

[11] 4,407,695
[45] Oct. 4, 1983

[54] NATURAL LITHOGRAPHIC FABRICATION OF MICROSTRUCTURES OVER LARGE AREAS

[75] Inventors: Harry W. Deckman, Clinton; John H. Dunsmuir, Madison, both of N.J.

[73] Assignee: Exxon Research and Engineering Co., Florham Park, N.J.

[21] Appl. No.: 363,019

[22] Filed: Mar. 29, 1982

Related U.S. Application Data

[63] Continuation-in-part of Ser. No. 336,036, Dec. 3, 1981.

[51] Int. Cl.³ .................. B44C 1/22; C03C 15/00; C03C 25/06; H01L 21/306
[52] U.S. Cl. .................. 156/643; 156/646; 156/659.1; 204/192 E; 427/198; 427/272; 427/282
[58] Field of Search .................. 427/43.1, 180, 183, 427/189, 195, 197, 198, 220, 221, 272, 282; 204/192 E; 430/5; 156/643, 646, 659.1, 661.1

[56] References Cited

U.S. PATENT DOCUMENTS 4,254,163  3/1981  Piazza ........................... 427/96
4,315,958  2/1982  Peiffer et al. .................. 427/214

OTHER PUBLICATIONS

U. Ch. Fischer and H. P. Zingsheim, J. Vac. Sci. Technol., 19(4), 881–885, Nov./Dec. 1981.
Appl. Phys. Lett., vol. 36, No. 9, May 1, 1980, A New Vacuum-Etched High-Transmittance (Antireflection) Film by Chris M. Horwitz, pp. 728–730.

Primary Examiner—William A. Powell
Attorney, Agent, or Firm—Ronald D. Hantman

[57] ABSTRACT pg,1 Large area random and mosaic arrays of identical submicron microcolumnar structures can be produced on surfaces by directionally ion etching a monolayer film of spherical colloidal particles.

27 Claims, 8 Drawing Figures

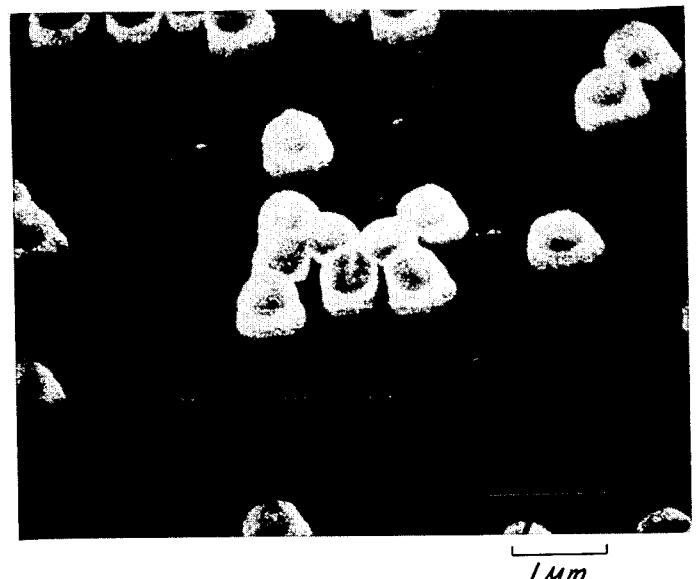
FIG. 3
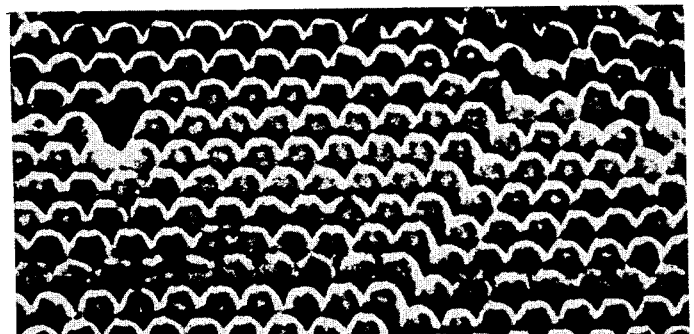

NATURAL LITHOGRAPHIC FABRICATION OF MICROSTRUCTURES OVER LARGE AREAS

This is a continuation-in-part of Ser. No. 336,036, filed on Dec. 31, 1981.

BACKGROUND OF THE INVENTION

The present invention relates to lithographic masks. In particular, the invention relates to masks used for etching of and deposition on surfaces.

Many areas of science and technology require submicrometer fabrication techniques for making patterns of submicrometer size in a surface of a material. This is particularly evident in the electronics industry where improvement in lithographic techniques have brought about a decrease in the size of individual components.

Most microfabrication techniques use fine-line lithography to transfer patterns into a radiation-sensitive resist to form a three-dimensional mask. These patterns are then transferred to the surface of the material by etching.

The surface to be etched is covered with a material, the resist, that resists attack by the etchant. The resist is patterned to expose the underlying areas to be etched. After the etching process, the resist is removed, leaving the desired pattern etched into the surface. A radiation-sensitive resist is one in which chemical or physical changes induced by ionizing radiation allow the resist to be patterned. After the resist is chemically or physically changed, it is developed. Resist development allows the dissolution of the resist film by a solvent in which the solubility varies strongly with resist irradiation. Most of the resists used in fine-line lithography are polymers functionally classified as belonging to two groups depending on whether their solubilities in the appropriate developers are markedly enhanced or diminished by irradiation. These resists are commonly called positive and negative resists, respectively.

There are two basic types of resisting processes, i.e., subtractive and additive. In the subtractive microfabrication process, the resist protects the unexposed material from attack by a liquid or gaseous etchant—usually called wet or dry etching, respectively. In wet etching the resist-coated sample is immersed in the etchant or the etchant is sprayed on its surface. There are three basic types of dry-etching processes: chemical etching, physical etching, and hybrid combinations of the two. Dry chemical etching is essentially the same as wet chemical etching except that the etchant is gaseous—usually reactive atoms or radicals produced in a plasma. Dry physical etching is usually called ion milling. A collimated beam of ions strikes the surface physically dislodging atoms and clumps of atoms. This process is primarily a physical one—the impinging ions are usually of a chemically inert species, such as Ar—so the relative etch rates of the resist and substrate are determined mostly by their relative mechanical properties.

In the additive microfabrication process, material is added to the substrate only in those areas unprotected by resists. Three methods are primarily used: lift-off, plating, and ion implanting. In the lift-off technique the resist is deliberately patterned with undercut, so that the overhanging resist material protects the resist sidewalls. Material is then deposited in a beam from a well-collimated source, such as an evaporation source located far from the substrate. The collimation is necessary so that the resist undercut prevents material buildup on the resist sidewalls. The material on the resist surface is removed when the resist is stripped from the substrate leaving behind the patterned material.

Another additive process that accurately reproduces micrometer and smaller resist features is plating. Both electroplating and electroless plating can be used to deposit material only in those areas unprotected by resist.

A third widely used additive process involving resisting is ion implantation. The chemical, physical, or electrical properties of materials are altered by bombarding the substrate with high energy ions (typically several hundred keV) of the appropriate chemical species. Adjustment of the ion energy alters the range of the ions before they come to rest, allowing control of the depth distribution of the added material.

SUMMARY OF THE INVENTION

The present invention is a method of producing a large area lithographic mask on the surface of a substrate. The mask is formed by coating the substrate with a mono-layer of colloidal particles such that the particles are fixed to the substrate. Depending upon the deposition technique used, the colloidal particles may be arranged on the surface in either a random or ordered array. This array of particles can then be used as a lithographic mask and the random or ordered array can be transferred to the substrate by a suitable etching process. The lithographic mask may also be used as a deposition mask.

BRIEF DESCRIPTION OF THE DRAWINGS

FIG. 3 shows a copy of an electron micrograph of individual microcolumnar silver posts produced by etching a mask according to the present invention.

FIG. 4 shows a copy of an electron micrograph of an etched silicon surface according to the present invention showing regions of ordered structure.

DESCRIPTION OF THE PREFERRED EMBODIMENT

Figure 1:
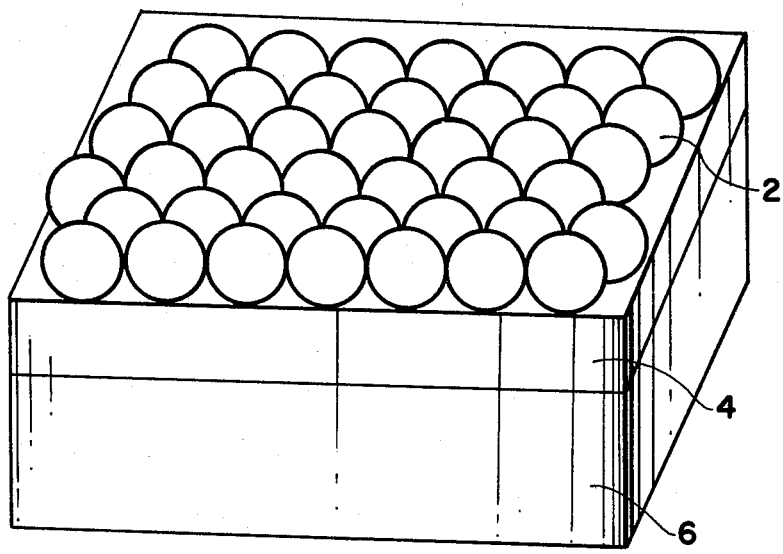
FIG. 1 shows a schematic diagram of ordered lithographic mask formed according to the method of the present invention.

The present invention is a method of producing a lithographic mask. The mask is formed by coating a substrate with a monolayer of colloidal particles substantially over the entire surface (about 90%) such that the particles are fixed to the substrate. The substrate is the material to be etched or the surface on which added material is deposited.

The technology of coating a substrate with a monolayer thick random array of colloidal particles is well known. Such coatings will be called random colloidal coatings and methods for producing them are described by Iler in U.S. Pat. No. 3,485,658, as well as in Iler, Journal of Colloid and Interface Science 21, 569–594 (1966); Iler, Journal of the American Ceramic Society 47 (4), 194–198 (1964); Marshall and Kitchener, Journal of Colloid and Interface Science 22, 342–351 (1966); and Peiffer and Deckman, U.S. Pat. No. 4,315,958. These coating techniques deposit a random array of colloidal particles on the substrate because the colloidal particles are electrostatically attracted to the substrates and adhere at the point where they strike the surface. Electrostatic attraction occurs because a surface charge opposite to that of the substrate is induced on the colloidal particles.

The aforementioned surface charge is created by the surface chemistry of the colloid and substrate. For instance colloidal particles suspended in water acquire a surface charge which may be adjusted by altering the pH of the water. In fact for many colloidal materials, the pH may be adjusted so that the colloid has zero net charge and this condition is referred to as an isoelectric point. Equivalently, the surface chemistry of most substrate materials produces a surface charge which can be altered by controlling the pH of water in which the substrate is immersed. If the charge on the colloid is opposite to that of the substrate, then a monolayer of colloidal particles can be attracted to the substrate. The time required to attract a monolayer of colloidal particles to the substrate depends on the relative charge of the colloid and substrate as well as the concentration of particles in the colloid. Typically a monolayer adheres within 1–200 sec when the substrate and colloid are oppositely charged. After the monolayer has been adhered the coated substrate is washed to remove any excess coating material and the substrate is blown dry with air or nitrogen to fix the coating onto the substrate.

If the substrate acquires a charge similar to that of the colloid, then one of two techniques can be used to deposit the colloidal particles. Providing the isoelectric points of the colloid and substrate are different, the pH of the colloidal suspension may be adjusted to produce oppositely charged surfaces. Or if it is not desirable to adjust the pH of the colloid, another colloid having a charge opposite to the substrate and the desired colloid may be deposited to change the sign of the surface charge on the substrate. Preferably the size of colloidal particles used to reverse the surface charge on the substrate should be small in comparison with the desired colloid. Specifically the colloid used to reverse the surface charge on the substrate should be sufficiently small so as not to interfere with the lithographic properties of the mask.

The composition of the colloidal particles in the coating may be organic or inorganic and be any material which can be rendered into a colloidal state wherein the particles have charged surfaces. In addition, the particles must have a resistance to the etchant or the deposition material so as to yield the desired pattern. This is discussed further below.

The technology for coating a substrate with a monolayer thick order array of particles requires that the colloid be applied while flowing across the substrate to be coated. The degree to which the arrays are ordered is dependent on the particle size, the degree of attraction to the substrate and the velocity of the flow along the substrate surface. The procedure used to produce random arrays of particles is not directly applicable to the production of ordered arrays.

A different coating procedure is used to produce an ordered array of colloidal particles on the substrate. In this case particles should be spherical. Colloidal particles may be ordered during the coating process by rotating the substrate in a horizontal plane about an axis normal to the surface. In this case, the substrate should be sufficiently flat to allow the particles to order during the spin coating process. The surface chemistry of the substrate must be adjusted so that the colloidal syspension wets the substrate. If the colloid fails to wet the substrate, the surface chemistry of the substrate may be changed by initially depositing a random colloidal coating of small oppositely charged colloidal particles. The ordered colloidal coating is produced by contacting the colloidal suspension with the substrate and then spinning the substrate at a speed sufficient to yield a densely packed ordered monolayer of colloidal particles. After contacting the colloid with the substrate no more than 10–20 seconds should elapse before the spinning process begins. If the final spin speed is too low a multilayer coating will be produced. If the final spin speed is too high voids will occur in the monolayer coating. Ordering of the particles in the size range 0.3–0.5 m is enhanced by having the particle concentration exceed 5% by weight of the colloidal suspension. Further improvements in the ordering of the particles may be obtained by chemically etching the substrate prior to depositing the ordered colloidal coatings.

For most applications, the most convenient colloidal particles are polymeric spheres, e.g., polystyrene, polydivinyl Benzene, and polyvinyl toluene. Such spheres are usually made by either suspension or emulsion polymerization. Such spheres can be conveniently fabricated in sizes ranging from 500 Å to 20 microns.

For random colloidal lithographic masks, the present invention produces masks over any sized substrate. However, for ordered arrays the size of the substrate must be sufficiently large to expel excess colloidal material upon rotation. For example, a minimum size is about 0.25 in$^2$.

Referring to FIG. 1 shows a schematic diagram of a lithographic mask produced according to the present invention wherein the colloidal particles are spherical. The mask is an array of colloidal particles 2 adhered to substrate 4. The substrate 4 is the material to be etched and, if necessary, is supported by support 6.

Figure 2:
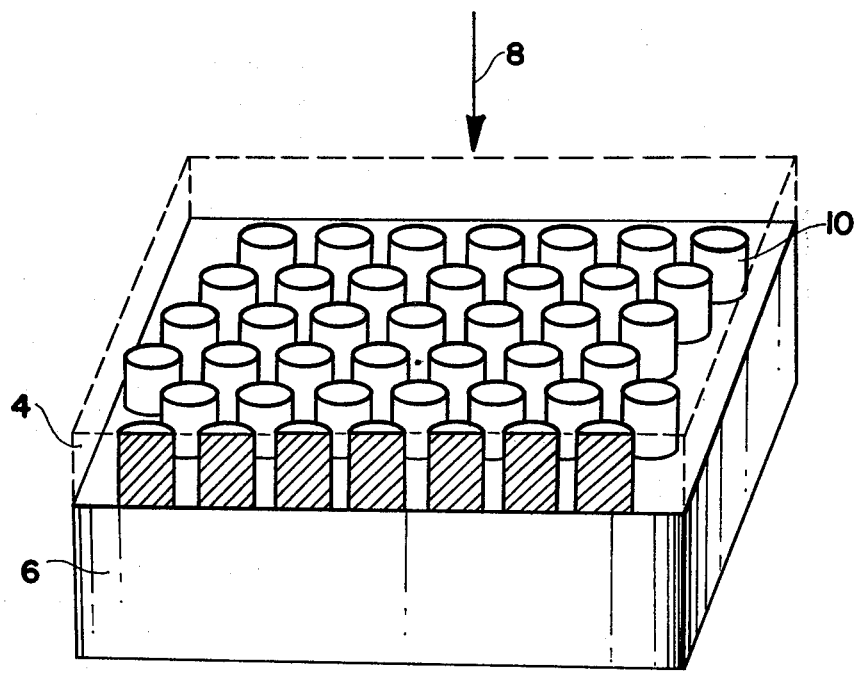
FIG. 2 shows a schematic diagram on an etched surface according to the present invention.

If the mask 2 is used as an etch mask, a beam of ions 8 may be directed at the surface to which are adhered the spheres 2. FIG. 2 shows a schematic diagram of microcolumnar posts which have been etched into the surface 4. The incident ion beam etches away the spheres 2 and surface 4. The relative etching rates of the spheres 2 and surface 4 determine the configuration of the etched surface 4.

The etched pattern is a regular array of posts 10. Each post 10 is cylindrical because the directional ion beam etching both the substrate and mask was terminated by the equator of the spherical mask before impinging on the substrate. Continued etching of the mask and substrate such that the diameter of the mask is significantly reduced during the etching process may result in either oblate or prolate spheroid posts depending on the relative etch rates of the mask and substrate.

If the substrate etches faster than the mask then prolate posts will be obtained. A mask which etches faster than the substrate results in oblate posts. Alternatively, a hemispherical morphology could be created by either an isotropic plasma etching process or by causing the polymer to melt during a directional etching process.

An advantage of the present technique for producing lithographic masks is that etched surfaces with random or regular arrays of submicron structures may be rapidly produced over large areas. Characteristic size of the microstructures can be varied by more than two orders of magnitude because monodisperse spheres are available in sizes ranging from ~200 Å to 40 m. The mean distance between particles is determined by the technique used to deposit the colloidal particles.

In addition, the lithographic mask may be used as a deposition mask as described above. In this case, material would be deposited between the particles adhered to the surface.

Utilities of the present invention include the preparation of surfaces of controlled roughness for optimization of the optical absorption properties of thin film solar cells and the preparation of isolated microcolumnar structures of various materials for use in studies of the enhanced surface Raman effect.

The advantages gained over other lithographic techniques in the case of thin film solar cells are the ability to generate masks for structures of controlled periodicity and aspect on a wide range of materials over large areas in a very short period of time. Masks can be prepared over areas of many square inches in less than one minute. Surfaces made from masks prepared by this technique have allowed signigicant improvements in the optical absorption properties of thin film solar cells.

Rough surfaces of carefully controlled periodicity and aspect have been prepared using these masks by both etching and "lift off" techniques for use in surface enhanced Raman experiments. Ease and speed of fabrication are also advantageous here. The principal advantage however is that natural lithographic techniques allow the fabrication of structure unavailable by other methods.

Similarly, rough surfaces of controlled periodicity and aspect can be produced for use as selective solar absorbers. Surfaces with microscopic structure of the proper dimensions can exhibit a high degree of spectral selectivity in regards to absorption and reflectance properties. Where the features on the surface are of the same order of size as the incident wavelength, a resonant scattering occurs where the selectivity results from a combination of the physical and geometric properties of the scatterer.

Previous methods of producing spectrally selective absorbing surfaces include chemical and physical deposition of material onto flat surfaces, etching of flat surfaces by chemical or physical means, and the delineation of patterns by conventional photo and electron lithography in resist on flat surfaces. (see e.g., Physics of Thin Films, Georg Hass and Maurice H. Francombe eds Academic Press, Vol. 10, 1978, pg. 57.) Structures produced by deposition and etching methods are limited by the intrinsic properties of the material being deposited or etched. The physical and geometric properties of the surfaces thus produced limit the range of available selective absorbers. Conventional photo and electron lithographies overcome these difficulties but encounter practical limits in producing very small features over large areas.

In contrast, natural lithographic techniques allow the rapid fabrication of very small features of carefully controlled periodicity and aspect over large areas in any material where the colloid acts as a resist. That is, the method of the present invention when applied to the fabrication of selective solar absorbers allows greater latitude in designing absorbers for a particular purpose. There are three parameters that may be altered in designing an absorber: choice of material, lateral distance between the microcolumnar posts and the ratio of the height to the base width of the posts (aspect ratio).

In general, the aspect ratio of a solar absorber should be greater than 1. A better value is 10. The microcolumnar posts should be as densely packed as possible, that is of the order of the wavelength of visible light to ten times this size.

If the solar absorber is used as the surface of a heat sink, then the absorber material might be chosen such that its reflectance is as near zero as possible for light and wavelength between 0.3 and 2 microns and as near one as possible for light with wavelength between 2 and 20 microns. Then as the sink heats up, the wavelength of the reradiated photons shifts to longer wavelengths by Wein's displacement law and the sink retains more of the absorbed heat.

Variations of the general fabrication method are discussed below.

Spherical metal colloidal particles instead of spherical polymer particles could be deposited to form the etch mask. This would permit direct fabrication of structures as small as ~50 Å, since metal spheres can be produced in this size range for example by solution reduction techniques.

Irregularly shaped microstructures could be produced in the 50–200 Å size range by etching through a layer of colloidal silica or alumina particles deposited on a surface.

Irregularly shaped microstructures in the 50–100 Å size range could be fabricated by using as an etch mask an island film deposited on a substrate. For example an evaporated silver film of ~200 Å thickness forms islands of ~50 Å dimension which can act as an etch mask. This is analogous to the basic technique described above since an island film is analogous to a particulate film and can be used for natural lithographic purposes.

EXAMPLE 1

Referring to FIG. 3 shows a copy of an electron micrograph of individual microcolumnar posts etched into a silver film. The post structures were prepared in the following manner:

(1) A silver film is deposited on a cleaned glass microscope slide 1 in. × 3 in. by thermal evaporation (or other suitable method).
(2) The fresh silver film is allowed to age in air so that the surface chemistry is compatible with later process steps. Alternatively an intermediate colloidal alumina layer is deposited.
(3) The prepared silver surface is dipped into a colloidal suspension of monodisperse polystyrene spheres of the desired size.
(4) Excess colloidal spheres are rinsed away leaving those spheres which are electrostatically bonded to the surface.
(5) The surface is blown dry with an air or nitrogen stream.
(6) The attached spheres are used as a mask for Argon Ion beam milling.
(7) After milling, residual polymer is removed by solvent washing.

EXAMPLE 2

Figure 8:
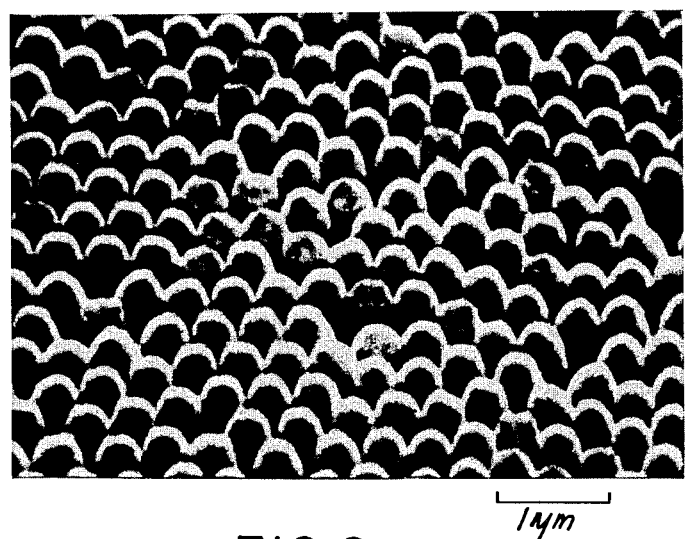
FIG. 8 shows an electron micrograph of an etched silicon surface according to the present invention showing the intersections of regions of ordered structures.

Referring to FIGS. 4 and 8 show an electron micrograph of microcolumnar posts fabricated substantially over the entire surface (over 90%) of a 3 in. silicon wafer by directional ion etching of colloidal polymer spheres applied by the spin coating method of the present invention. The posts were prepared in the following manner:

(1) A clean 3 in. silicon wafer is dipped into colloidal alumina of about 70 Å particle size, rinsed and blown dry leaving an alumina monolayer compatible with subsequent process steps.
(2) The surface of the wafer is flooded with a colloidal suspension of 5000 Å polymer spheres and spun at an appropriate speed (about 3000 rpm) until dry.
(3) The attached spheres in dense packed micro cystalline arrays are used as an etch mask for Reactive Ion beam milling ($CF_4$).
(4) Residual polymer is removed after etching by a solvent wash and wipe.

EXAMPLE 3

Microcolumnar posts in $SiO_2$ may be prepared in a manner exactly analogous to Example 2.

EXAMPLE 4

Figure 5:
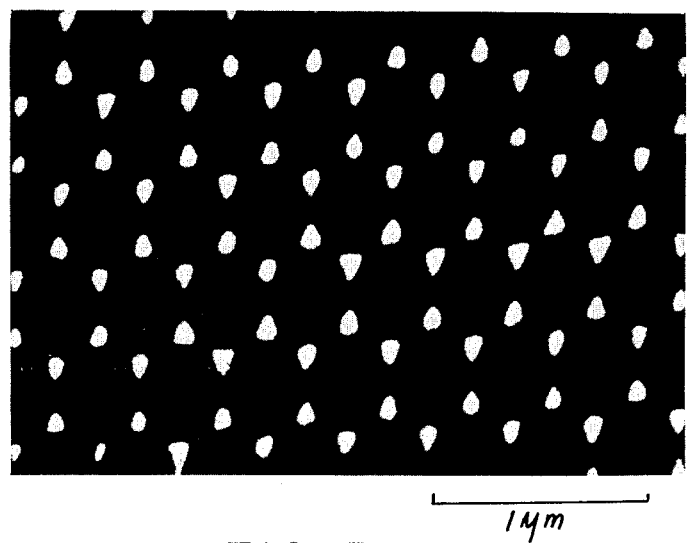
FIG. 5 shows a copy of an electron micrograph of a microcolumnar silver posts prepared by the lift-off technique according to the present invention.

Referring to FIG. 5 shows an electron micrograph of microcolumnar silver posts prepared by the "lift off" technique in the following manner:

(1) A clean 3 in. silicon wafer is dipped into colloidal alumina of very small particle size, rinsed and blown dry leaving an alumina monolayer.
(2) The surface of the substrate is flooded with a colloidal suspension of polymer spheres and spun at an appropriate speed until dry thus forming the deposition mask.
(3) The substrate is placed in a thermal evaporator or other suitably directional metallization process and coated to a desired thickness with silver (or other metal).
(4) The substrate is removed from the evaporator and the polymer sphere mask is removed by either dissolving the spheres in an appropriate solvent or by ultrasonic cleaning or both. Such that the silver film deposited in the interstices of the polymer mask remain on the substrate thereby forming an array of posts.

EXAMPLE 5

Figure 6:
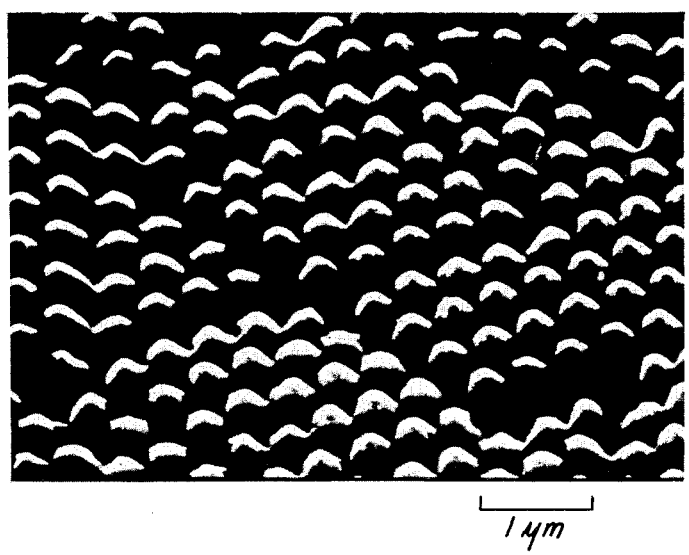
FIG. 6 shows a copy of an electron micrograph of faceted microcolumnar silicon posts prepared according to the present invention.

Referring to FIG. 6 shows an electron micrograph of faceted microcolumnar silicon posts prepared by Ion milling a silicon surface. The colloidal mask is prepared as in Example 4 and etched by an Argon Ion beam. Since the silicon and the polymer spheres have similar etch rates a prolate geometry is favored. Also, the physical processing of the ion beam is such that facets, a flattening of the sides at a preferred angle, occurs.

EXAMPLE 6

Figure 7:
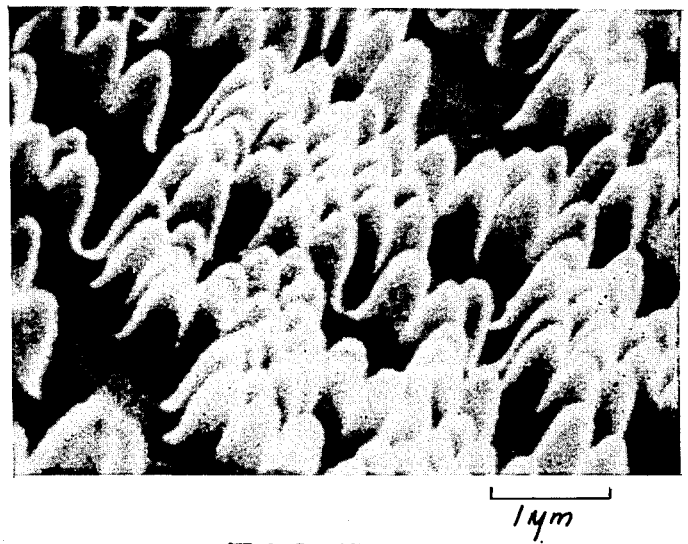
FIG. 7 shows an electron micrograph of prolate microcolumnar silicon posts prepared according to the present invention.

Referring to FIG. 7 shows an electron micrograph of prolate microcolumnar silicon posts prepared by reactive ion beam etching of a silicon surface. The colloidal mask is prepared as in Example 1 using an alumina interlayer in Step 2. The prolate geometry is obtained in this case by reactive ion milling in a high background pressure of reactive gas. The process is thus made less directional and side areas exposed early in the etch process are etched laterally for a longer period of time than those exposed later in the process. Therefore a post with a smoothly tapered sidewall is fabricated. The degree of taper may be varied by controlling the background pressure of reactive gas.

EXAMPLE 7

1. A clean 3 in. silicon wafer is flooded with a colloidal suspension of polymer spheres which wet the surface. The wafer is spun at an appropriate speed until dry thus forming an ordered etching mask.
2. The attached spheres in a dense packed micro crystalline array covered more than 90% of the area are used as an etch mask for reactive ion beam milling ($CF_4$).
3. Residual polymer is removed after etching by a solvent wash and wipe.

What is claimed is:

1. A method producing a lithographic mask on the surface of a substrate comprising coating said substrate with a monolayer of colloidal particles substantially over the entire surface such that said particles are fixed to said substrate in a predetermined way as to particle size distribution and mean distance between particles, said monolayer of colloidal particles serving as an etch mask for forming an etched pattern in said substrate.

2. The method of producing a lithographic mask of claim 1 for forming an etched pattern in said substrate further comprising the step of etching a pattern in said substrate.

3. The method of producing a lithographic mask for forming an etched pattern in said substrate of claim 2 wherein said etching step is performed with a reactive plasma.

4. The method of producing a lithographic mask for forming an etched pattern in said substrate of claim 3 wherein said etching step is performed with an ion beam.

5. The method of producing a lithographic mask for forming an etched pattern in said substrate of claim 3 wherein said etching step is performed by chemical means.

6. A method of producing an ordered lithographic mask on the surface of a substrate comprising:
(a) depositing a dispersion of colloidal particles of predetermined size onto said substrate such that a monolayer of colloidal particles are fixed to said substrate; and
(b) dispelling any excess of said monolayer of said colloidal particles from said substrate such that said monolayer is ordered; said monolayer of colloidal particles serving as an etch mask for forming an etched pattern in said substrate.

7. The method of producing a lithographic mask which is ordered of claim 6 further comprising the step of etching a pattern in said substrate.

8. The method of producing a lithographic mask which is ordered of claim 7 wherein said etching step is performed with a reactive plasma.

9. The method of producing a lithographic mask which is ordered of claim 7 wherein said etching step is performed with an ion beam.

10. The method of producing a lithographic mask which is ordered of claim 7 wherein said etching step is performed by chemical means.

11. The method of producing a lithographic mask of claim 1 for deposition on said substrate further comprising the step of depositing a metal onto said substrate so as to fill the space between said colloidal particles fixed to said substrate.

12. The method of producing a lithographic mask for deposition on said substrate of claim 11 wherein said depositing step is performed by condensing a metal vapor onto said substrate.

13. The method of claim 11 wherein said colloidal particles fixed to said substrate are ordered.

14. The method of claim 12 wherein said colloidal particles fixed to said substrate are ordered.

15. The method of producing a lithographic mask of claim 1 wherein said colloid particles are polymer particles.

16. The method of claim 15 wherein said polymer particles are spherical.

17. The method of claim 16 wherein said particles are monodispersed spherical polymer particles.

18. The method of producing a lithographic mask which is ordered of claim 6 wherein the rotating step begins within 10 to 20 sec. of said depositing step.

19. The method of claim 6 wherein said dispelling step is performed by rotating said substrate.

20. The method of claim 19 wherein the rotating step is performed as a rotation speed such that a void free single layer is produced.

21. The method of producing a lithographic mask which is ordered of claim 19 wherein the rotating step is performed at a rotation speed greater than 2000 revolutions per minute.

22. A method for producing a spectrally selective absorbing surface comprising: coating said substrate with a monolayer of colloidal particle substantially over the entire surface such that said particles are fixed to said substrate in a predetermined way as to particle size distribution and mean distance between particles; etching a pattern in said substrate of microcolumnar posts.

23. The method of claim 22 wherein the microcolumnar posts have an aspect ratio of greater than 1.

24. The method of claim 22 wherein the microcolumnar posts have an aspect ratio of greater than 10.

25. The method of claim 22 wherein the microcolumnar posts have an aspect ratio of greater than 20.

26. The method of claim 22 wherein the microcolumnar posts are spaced apart a distance about the wavelength of visible light.

27. The method of claim 22 wherein the microcolumnar posts are spaced apart a distance about ten times the wavelength of visible light.

* * * * *